Dec. 22, 1964 P. L. ANDERSON ETAL 3,161,945

METHOD OF MAKING A PRINTED CIRCUIT

Filed May 21, 1958 2 Sheets-Sheet 1

INVENTORS
John A. Zagusta
Paul L. Anderson
BY Robert R. Churchill
ATTORNEY

METHOD OF MAKING A PRINTED CIRCUIT

Filed May 21, 1958 2 Sheets-Sheet 2

INVENTOR.
John A. Zagusta
BY Paul L. Anderson

Robert R. Churchill
ATTORNEY

United States Patent Office 3,161,945

Patented Dec. 22, 1964

3,161,945

METHOD OF MAKING A PRINTED CIRCUIT

Paul L. Anderson, Rockville, Conn., and John A. Zagusta, Jackson Heights, N.Y., assignors to Rogers Corporation, Manchester, Conn., a corporation of Massachusetts Filed May 21, 1958, Ser. No. 736,846
2 Claims. (Cl. 29—155.5)

This invention relates to a printed circuit and to a method of making the same.

The invention has for an object to provide a novel and improved printed circuit embodying a resin impregnated fibrous insulating base member and an electrically conductive pattern wherein the pattern is securely bonded to the base member in a simple, economical and efficient manner.

A further object of the invention is to provide a novel and improved method of producing a printed circuit of the character specified.

With these general objects in view and such others as may hereinafter appear, the invention consists in the printed circuit and in the method of making the same as hereinafter described and particularly defined in the claims at the end of this specification.

In the drawings illustrating the preferred embodiment of the invention:

Figure 1:
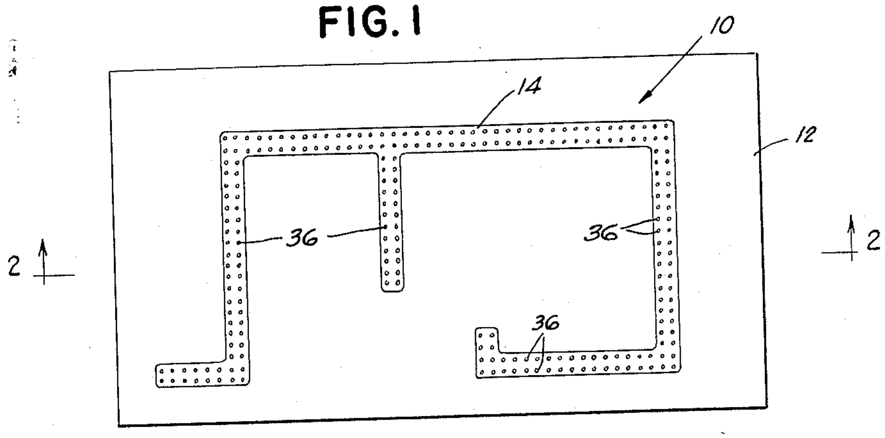
FIG. 1 is a plan view of a printed circuit embodying the present invention.
Figure 2:
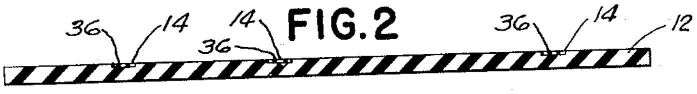
FIG. 2 is a cross sectional view taken on the line 2—2 of FIG. 1.
Figure 3:
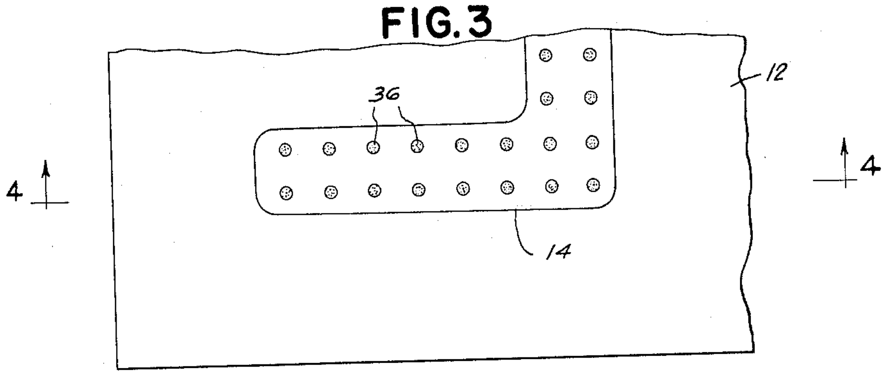
FIG. 3 is an enlarged plan view of a portion of the printed circuit shown in FIG. 1.
Figure 4:
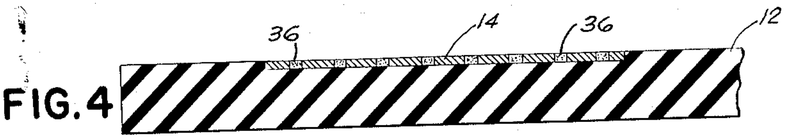
FIG. 4 is an enlarged cross sectional view taken on the line 4—4 of FIG. 3.

In general the present invention contemplates a printed circuit of the type having a fibrous insulating base and preferably fibrous insulating base embodying a curable resin and a conductive metal foil pattern secured to a surface thereof. Following the disclosures in a copending application, Serial No. 566,962, to Norman L. Greenman and the present applicants, filed February 21, 1956, now Patent Number 2,972,003, such printed circuits have been produced by adhesively securing a conductive metal foil pattern to the insulating base, the adhesive employed being preferably of a type which may be subsequently cured by the application of heat and pressure. The assembly was then placed in a flash mold and subjected to temperatures and pressures such as to effect curing of the moldable material and the heat curable adhesive to bond the metal pattern to the insulating base member. Such adhesive is also provided with an elastomeric modifying agent to permit yielding of the adhesive to compensate for the different rates of expansion and contraction between the metal pattern and the moldable base material. One disadvantage of such adhesively secured pattern assemblies is that, upon curing, the modified adhesive cannot thereafter be subjected to excessive temperatures over a prolonged period of time, the threshold temperature of the adhesive before heat destruction being usually about 105° C., thus limiting the use of the printed circuits produced in accordance with the above application to installations wherein excessive heat is not a factor.

As illustrated and described in the copending application, Serial No. 566,962, above referred to, the moldable base material is caused to flow during the molding operation to provide a moisture-resistant resin skin covering the exterior surfaces of the base assembly. In accordance with the present invention the printed circuit herein illustrated comprises a moldable fibrous insulating base embodying a curable resin and a porous conductive metal, such as a perforated metal conductive pattern, which is applied to the insulating base. The assembly is placed in a flash mold and subjected to sufficient heat and pressure to effect the flow of the base material resin into the perforated openings to also cure the base material and to key or bond the metal pattern to the base material. This results in a highly efficient bond being effected between the metal pattern and the base during the curing operation without the use of adhesive. Alternatively, the assembly may be placed between pressure plates and subjected to heat and pressure such as to effect the flow of the resin into the perforations and curing of the base material to produce the laminated structure. As a result of the present method of producing a printed circuit, among other advantages, the printed circuit may be more economically produced, and the resulting product may be employed in installations or subjected to subsequent manufacturing processes, such as solder dipping, operated at elevated temperatures without harmful effect. Such uses are limited only by the threshold temperature of the base material used at which temperature the base material begins to deteriorate.

Referring now to the drawings, 10 represents a printed circuit produced in accordance with the present invention and which may comprise a moldable fibrous insulating base 12 embodying a curable resin and having perforated metal conductive pattern 14 bonded thereto by the resinous base material caused to flow into the openings during the curing operation. In practice the conductive pattern may comprise a relatively thin metal foil which may be preperforated and may be formed and applied to the uncured insulating base by a stamping or blanking operation in accordance with any known practices or in the manner disclosed in the copending application, Serial No. 566,962, above referred to, or in the manner disclosed in a second copending application, Serial No. 638,491, filed February 6, 1957, now Patent Number 2,986,804 by the same inventors. Thus, in operation a sheet of the preperforated foil may be placed in a pattern-blanking and embedding die having provision for blanking out the metal foil pattern from the sheet and transferring and preferably embedding the perforated metal foil pattern in the surface of the moldable base material. The blanking die may and preferably will be heated and is operated with sufficient pressure to cause the pattern to become embedded or partially embedded in the uncured moldable base material so as to prevent detachment of the foil pattern during handling and transferring to the flash mold.

Alternatively, in accordance with the disclosure in the copending application, Serial No. 638,491, the formation of the electrically conductive metallic pattern on the moldable fibrous insulating base may be accomplished by a punching or die-stamping operation wherein a metal foil sheet is placed on the upper surface of the uncured base material and is impressed into the base material, the surface of the uncured base material cooperating with the stamping die to shear the metal sheet to form the desired pattern and to embed the conductive pattern into the surface of the base material. The unwanted metal remaining on the upper surface after the shearing operation may be subsequently removed and salvaged in any well known manner. In accordance with this method the punch may also preferably be heated to partially set and embed the pattern into the base member to permit handling of the assembly without inadvertent detachment of the pattern prior to curing of the assembly.

It will be understood that in any of the above described methods of applying the conductive metal pattern to the base member, the punch member may preferably be provided with indexing punches for piercing the insulating base material for registration purposes.

Figure 5:
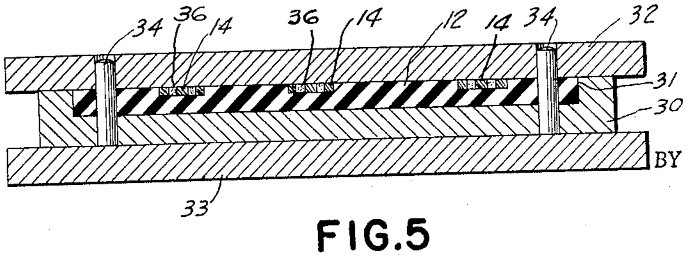
FIG. 5 is a cross sectional view of a flash mold employed in producing the present printed circuit.
Figure 9:
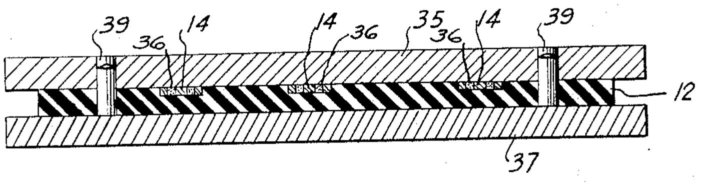
FIG. 9 is a cross sectional view of laminating apparatus which may be employed in producing the present printed circuit.

After the metal foil pattern 14 is applied to the moldable base material 12 in its uncured form in accordance with either of the methods above defined or in accordance with other known methods, and without the use of adhesive, the assembly may then be placed in a flash mold, as shown in FIG. 5, to effect curing of the resinous base material. The illustrated mold includes a bottom plate 30 provided with a cavity 31 into which the printed circuit assembly is placed; a top plate 32; and a pin carrying plate 33 provided with registration pins 34 corresponding to the pierced openings in the base member, the top and bottom plates being drilled to receive the registration pins, as shown. Alternatively, as illustrated in FIG. 9, the printed circuit assembly may be placed between upper and lowed pressure plates 35, 37, the lower plate 37 having registration pins 39 extended through the pierced openings in the base member and into drilled openings in the upper plate. The molding and laminating operation may be conducted in accordance with known procedure utilizing the proper temperature, time and pressure cycle depending upon the character of the fibrous base and the amount and the character of the resin embodied in the fibrous base. Thus, the assembly is subjected to heat and pressure, sufficient to effect curing of the moldable fibrous material and to result in the flow of the curable resin in the base material into the openings in the perforated metal foil to effect keying of the metal foil pattern 14 to the base material 12 during the curing operation whereby to provide a secure bonding of the electrical conductive pattern to the base material. Preferably, the product may be subjected to a subsequent baking operation to insure completion of the bonding and curing.

From the description thus far it will be seen that the present printed circuit comprising a porous metal conducting pattern, such as a perforated metal pattern, is die-stamped and embedded or partially embedded into the surface of the uncured resin impregnated insulating base, and upon curing of the assembly the resinous material caused to flow into the openings of the perforated foil 14 effects bonding of the conductive foil to the base material without the use of adhesive between the foil and the base. The present invention also contemplates disposition of the circuit pattern above or below the surface of the base material. As a result of the present method, the manufacturing costs may be reduced considerably since the cost of the preperforated metal foil is substantially less than the adhesive coated metal foil. Any base metal may be used which may or may not be subjected to preplating or precoating. Also, the metal foil need not be precleaned in the manner usually required with a foil having a curable adhesive. This also results in a reduction of the manufacturing costs.

Another advantage in the use of the perforated foil is the elimination of the use of adhesive between the foil and the base member. The use of adhesive between the foil and the base material limits the temperature at which the printed circuit assembly can be dipped soldered since the melting point of the adhesive is relatively low, about 105° C., and the assembly would become delaminated under the effects of the hot solder. This delamination is substantially eliminated since the melting point of the base material, usually about 150° C., is sufficiently high enough to permit the assembly to withstand the temperature of the hot solder. Furthermore, even if the threshold temperature of the base material was exceeded, the metal pattern would still adhere to the base material since the pattern is mechanically keyed thereto. Another advantage in the use of a perforated metal pattern is that it substantially eliminates any blistering of the foil during the curing operation. In practice it is preferred to use a thermosetting resin as the impregnant for the fibrous insulating base 12 which resin may be of a heat curable type, a pressure curable type, or preferably of a heat and pressure curable type. Such resins included the phenolic formaldehyde resins, the melamine resins, epoxy resins, polyester resins, the urea formaldehyde resins, silicones and others. The perforated conductive metal foil forming the circuit pattern may comprise a relatively thin copper foil about .003" or more in thickness.

While it is preferred that a fibrous board sheet be used, such fibers may include cellulose, glass, asbestos, similar fibers, such as polyamide, polyester and aluminum oxide fibers, and various mineral fibers or any combinations thereof, and in the broader aspect of the invention any fibrous sheet impregnated with a resinous material may be used as the insluating base for the reception of the perforated metal circuit pattern prior to the molding or laminating operation.

The preperforated metal may preferably be selected with regard to its metal-to-void area so as to provide an efficient, electrically conductive pattern. Thus, in one embodiment of the invention the perforations 36 may be .020" in diameter on .0450" centers, representing a metal to-void area of 81.4%. In another embodiment of the invention, providing a more efficient metal-to-void area, the holes 36 may be .023" in diameter spaced on .084" centers which represents a metal-to-void area of 88%. The shape of the holes 36 is preferably round, although any shape may be used. It will be understood that the keying action depends upon the resin gripping upon the irregularities in the holes and also upon the relative shrinkage between the metal 14 and the base material 12 during and after the curing operation. While the current rating of the perforated metal in the last-named example is about 88% comprising a reduction of 12%, comparable to an unperforated metal of the same dimensions, actually in practice without the use of the adhesive which has a threshold temperature of 105° C., the permissible current can be substantially increased to a limit approaching the threshold temperature of the base material itself. Thus with the base material presently employed having a threshold temperature of 150° C. plus, the permissible current may be increased by approximately 50% which more than offsets the decrease in cross sectional area of the preperforated foil. The threshold temperature of the conductive metal foil usually employed is 450° C. or more.

Figure 6:
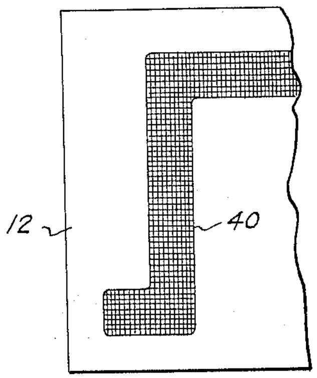
FIGS. 6 and 7 are plan views of portions of printed circuits illustrating modified forms of the present invention.
Figure 7:
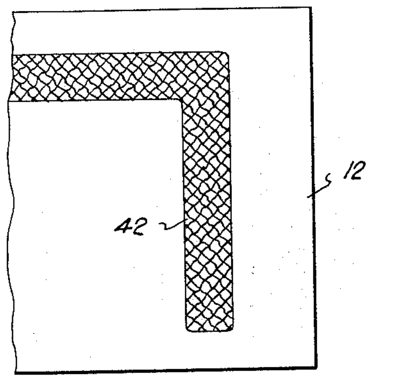

While the preperforated foil provides an efficient and economical conductive pattern, the present invention also contemplates other conductive materials of a porous nature through which the resin of the base material may flow during the molding operation to key the conductive metal thereto. Thus, in a modified form of the invention the conductive pattern may comprise metal screening 40, as illustrated in FIG. 6, or the conductive pattern may comprise braided metal 42, as illustrated in FIG. 7. While these materials provide a less efficient metal-to-void area and are generally more costly they may prove to be more desirable for particular types of installations.

As illustrated in FIGS. 5 and 9, it will be seen that during the molding and laminating operations the top plate of the mold or laminating apparatus presses against the upper surface of the pattern 14 to embed the pattern into the moldable material and to present the upper surface of the metal pattern flush with the upper surface of the base member 12. Also, during the molding or laminating operation, the resin which flows into the perforated openings is prevented from bridging across the upper surface of the metal foil by the intimate contact of the upper half of the mold. While some slight extrusion may occur to provide a riveting, keying or anchoring effect, any excessive covering or bridging of the foil with the exuded resin may interfere with subsequent soldering operations. Conversely, soldering operations to connect leads to the upper surface of the foil may preferably bridge across the openings, thus increasing the current carrying capacity.

Figure 8:
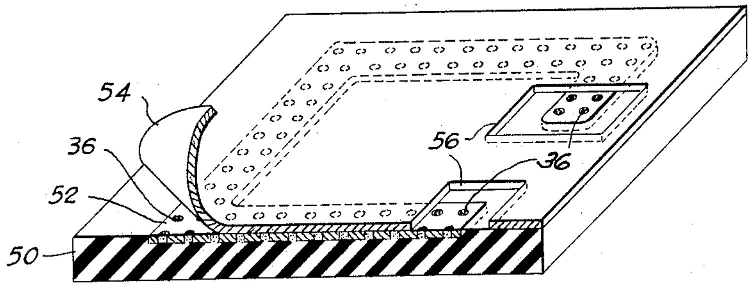
FIG. 8 is a perspective view partly in cross section illustrating another embodiment of the invention.

Referring now to FIG. 8, the printed circuit therein illustrated comprises an insulating base member 50 embodying a curable resin; a perforated conductive metal foil pattern 52; and a sheet of a tough, thin plastic dielectrict film overlay 54 embodying a curable resinous or elastomeric base material. In this embodiment of the invention, the desired contact points of the printed circuit may be exposed through precut openings 56 in the overlay, as shown, and in accordance with the present invention, when the assembly is placed in a flash mold and subjected to heat and pressure, the contacting portions of the base 50 and the overlay 54 will be laminated together, and the resin exuded through the openings 36 in the metal pattern will bond the metal to the base member and to the overlay without the use of adhesive. It will be apparent that this expedient may also be used to bond a perforated metal sheet between two layers of resinous or elastomeric base materials without the use of adhesive whereby to produce an intimate laminated bond between the elements of the assembly.

In the claims the term "perforated metal" is intended to include either a perforated foil, screening, braided material or other electrically conductive material having interstices through which the fibrous, resin impregnated, moldable base material may flow during the curing operation.

While the perferred embodiment of the invention has been herein illustrated and described, it will be understood that the invention may be embodied in other forms within the scope of the following claims.

Having thus described the invention, what is claimed is:

1. The method of making a printed circuit assembly comprising the steps of perforating a relatively thin conductive metal foil sheet, die-cutting a circuit pattern from the sheet against an uncured insulating base sheet embodying a curable resin, removing the unwanted foil and molding the foil sheet and base sheet by applying heat and pressure to flow the base sheet resin into the perforations and key the foil sheet to the base sheet upon curing of the base sheet.

2. The method of making a printed circuit assembly comprising the steps of perforating a relatively thin conductive metal foil sheet, cutting a predetermined circuit pattern from the foil sheet and simultaneously embedding the pattern into an insulating base sheet embodying a curable resin to present the surface of the foil sheet flush with the surface of the base sheet, removing the unwanted foil, and curing the base sheet and foil assembly to bond the same together by flowing the resin into the perforations and then curing the same.

References Cited in the file of this patent

UNITED STATES PATENTS

| | | |
|---|---|---|
| 84,932 | Beals | Dec. 15, 1868 |
| 1,718,993 | Wermine | July 2, 1929 |
| 1,962,584 | Davies | June 12, 1934 |
| 2,405,987 | Arnold | Aug. 20, 1946 |
| 2,431,393 | Franklin | Nov. 25, 1947 |
| 2,688,581 | Stubbs | Sept. 7, 1954 |
| 2,736,677 | Eisler | Feb. 28, 1956 |
| 2,861,911 | Martin et al. | Nov. 25, 1958 |

FOREIGN PATENTS

| | | |
|---|---|---|
| 198,739 | Great Britain | June 1, 1923 |
| 163,419 | Australia | June 20, 1955 |

UNITED STATES PATENT OFFICE
CERTIFICATE OF CORRECTION

Patent No. 3,161,945 December 22, 1964

Paul L. Anderson et al.

It is hereby certified that error appears in the above numbered patent requiring correction and that the said Letters Patent should read as corrected below.

Column 1, line 47, after "preferably" insert -- a moldable --; column 4, line 19, for "insluating" read -- insulating --; column 4, line 50, for "450° C." read -- 250° C. --.

Signed and sealed this 4th day of May 1965.

(SEAL)
Attest:

ERNEST W. SWIDER
Attesting Officer

EDWARD J. BRENNER
Commissioner of Patents